US012190957B2

(12) United States Patent
Miccoli et al.

(10) Patent No.: US 12,190,957 B2
(45) Date of Patent: Jan. 7, 2025

(54) DYNAMIC STEP VOLTAGE LEVEL ADJUSTMENT

(71) Applicant: Micron Technology, Inc., Boise, ID (US)

(72) Inventors: Carmine Miccoli, Boise, ID (US); Andrew Bicksler, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 170 days.

(21) Appl. No.: 17/939,273

(22) Filed: Sep. 7, 2022

(65) Prior Publication Data

US 2023/0133227 A1  May 4, 2023

Related U.S. Application Data

(60) Provisional application No. 63/274,776, filed on Nov. 2, 2021.

(51) Int. Cl.
| | |
|---|---|
| *G11C 16/08* | (2006.01) |
| *G11C 16/10* | (2006.01) |
| *G11C 16/12* | (2006.01) |
| G11C 16/24 | (2006.01) |
| G11C 16/32 | (2006.01) |

(52) U.S. Cl.
CPC .............. *G11C 16/12* (2013.01); *G11C 16/08* (2013.01); *G11C 16/102* (2013.01); *G11C 16/10* (2013.01); *G11C 16/24* (2013.01); *G11C 16/32* (2013.01)

(58) Field of Classification Search
CPC ........ G11C 16/12; G11C 16/08; G11C 16/102
USPC ...................................................... 365/189.11
See application file for complete search history.

(56) References Cited

U.S. PATENT DOCUMENTS

| | | | | |
|---|---|---|---|---|
| 11,456,042 B1* | 9/2022 | Yang | ................... | G11C 16/0483 |
| 2008/0273385 A1* | 11/2008 | Goda | ................... | G11C 11/5628 |
| | | | | 365/185.03 |
| 2010/0195387 A1* | 8/2010 | Park | ....................... | G11C 16/10 |
| | | | | 365/185.03 |
| 2019/0362799 A1* | 11/2019 | Yang | ................... | G11C 16/3459 |
| 2021/0343335 A1* | 11/2021 | Chiang | ................ | G11C 16/349 |
| 2022/0310167 A1* | 9/2022 | Ning | ....................... | G11C 16/26 |

* cited by examiner

*Primary Examiner* — Ly D Pham
(74) *Attorney, Agent, or Firm* — LOWENSTEIN SANDLER LLP

(57) ABSTRACT

Processing logic in a memory device receives a request to execute a programming operation on a set of memory cells of the memory device. A first set of programming pulses corresponding to a first step voltage level are caused to be applied to one or more wordlines associated with the set of memory cells. The processing logic determines that a programming voltage level associated with a programming pulse of the first set of programming pulses satisfies a condition. A second set of programming pulses corresponding to a second step voltage level is caused to be applied to the one or more wordlines associated with the set of memory cells in response to the condition being satisfied.

19 Claims, 11 Drawing Sheets

|  300 |
| --- |

| 350₀ | 350₁ | 350₂ | 350₃ |
| --- | --- | --- | --- |
| Block₀ 250₀ | Block₀ 250₀ | Block₀ 250₀ | Block₀ 250₀ |
| Block₁ 250₁ | Block₁ 250₁ | Block₁ 250₁ | Block₁ 250₁ |
| Block₂ 250₂ | Block₂ 250₂ | Block₂ 250₂ | Block₂ 250₂ |
| Block₃ 250₃ | Block₃ 250₃ | Block₃ 250₃ | Block₃ 250₃ |
| Block₄ 250₄ | Block₄ 250₄ | Block₄ 250₄ | Block₄ 250₄ |
| ⋮ | ⋮ | ⋮ | ⋮ |
| Block_{L-4} 250_{L-4} | Block_{L-4} 250_{L-4} | Block_{L-4} 250_{L-4} | Block_{L-4} 250_{L-4} |
| Block_{L-3} 250_{L-3} | Block_{L-3} 250_{L-3} | Block_{L-3} 250_{L-3} | Block_{L-3} 250_{L-3} |
| Block_{L-2} 250_{L-2} | Block_{L-2} 250_{L-2} | Block_{L-2} 250_{L-2} | Block_{L-2} 250_{L-2} |
| Block_{L-1} 250_{L-1} | Block_{L-1} 250_{L-1} | Block_{L-1} 250_{L-1} | Block_{L-1} 250_{L-1} |
| Block_L 250_L | Block_L 250_L | Block_L 250_L | Block_L 250_L |
| 240₀ | 240₁ | 240₂ | 240₃ |

| Wordline group | Initial Vstep | Adjusted Vstep | Initial Tpulse | Adjusted Tpulse |
|---|---|---|---|---|
| Wordline Group 1 | 0.55V | 0.10V | 0.10µs | 0.20µs |
| Wordline Group 2 | 0.50V | 0.15V | 0.15µs | 0.25µs |
| ... | ... | ... | ... | ... |
| Wordline Group N | 0.53V | 0.2V | 0.10µs | 0.20µs |

DYNAMIC STEP VOLTAGE LEVEL ADJUSTMENT

CROSS-REFERENCE TO RELATED APPLICATION

This application claims the benefit of U.S. Provisional Application No. 63/274,776, titled "Dynamic Step Voltage Level Adjustment," filed Nov. 2, 2021, the entire disclosure of which is incorporated herein by reference.

TECHNICAL FIELD

Embodiments of the disclosure relate generally to memory sub-systems, and more specifically, relate to dynamic step voltage level adjustment during programming of memory cells in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B, in accordance with one or more embodiments of the present disclosure.

FIG. 6 is an example data structure including information identifying adjustable step voltage levels of a programming operation corresponding to different wordline groups associated with memory cells of a memory array, in accordance with one or more embodiments of the present disclosure.

DETAILED DESCRIPTION

Figure 1A:
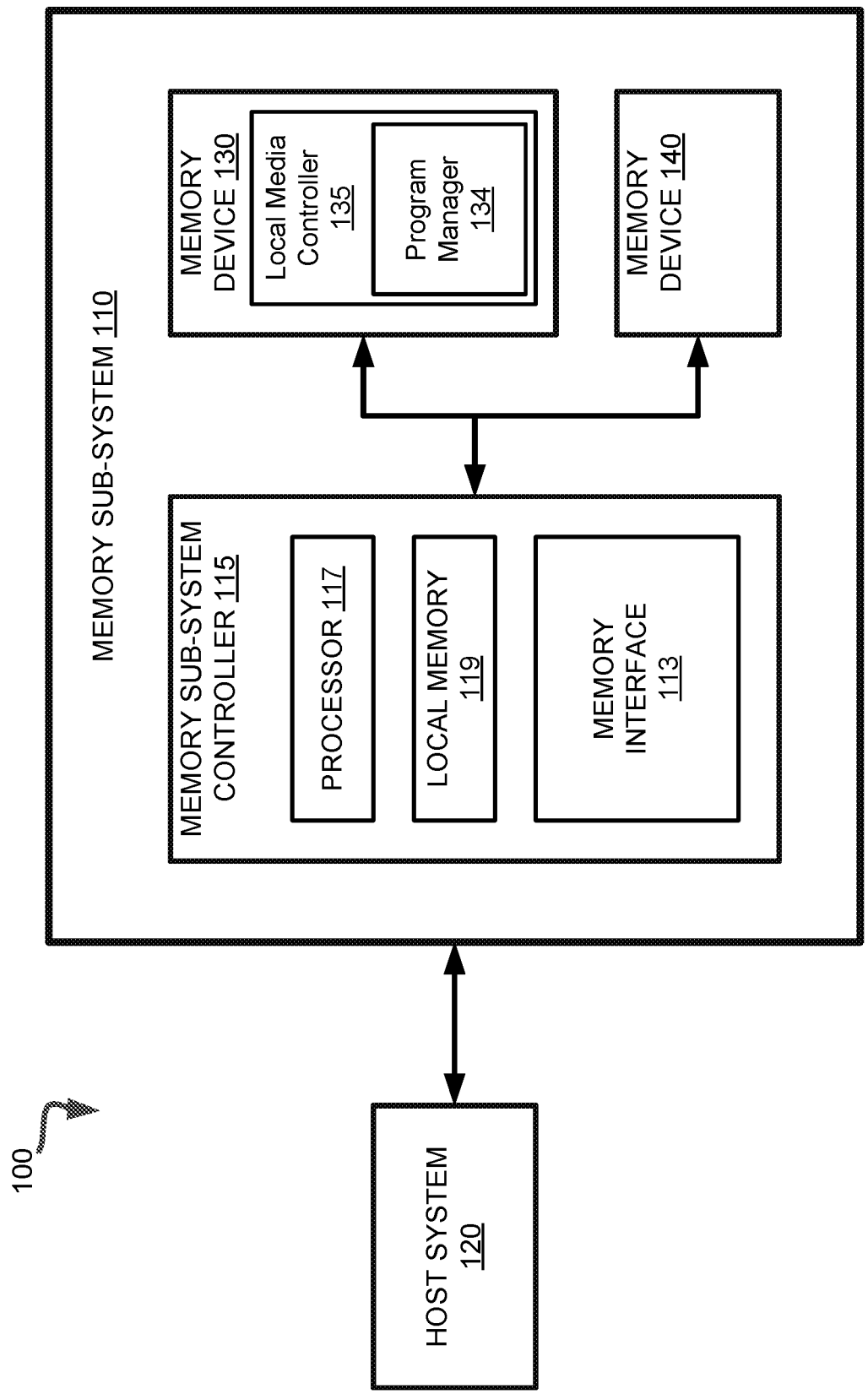
FIG. 1A illustrates an example computing system that includes a memory sub-system in accordance with one or more embodiments of the present disclosure.

Aspects of the present disclosure are directed to a programming operation including a series of programming pulses having an adjustable step voltage level. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

Memory access operations (e.g., a program operation, an erase operation, etc.) can be executed with respect to the memory cells by applying a wordline bias voltage to wordlines to which memory cells of a selected page are connected. For example, an Incremental Step Pulse Programming (ISPP) process or scheme can be employed to maintain a tight cell threshold voltage distribution for higher data reliability. In ISPP, a series of high-amplitude pulses of voltage levels having an increasing magnitude are applied to wordlines to which one or more memory cells are connected to gradually raise the voltage level of the memory cells to above a voltage level associated with a target programming level. In a typical ISPP programming algorithm, the voltage level of each programming pulse (Vpgm) is increased by a static or uniform amount (e.g., a predefined programming pulse step height or level). The increment in voltage for each successive programming pulse is referred to herein as the step voltage or Vstep. The application of the uniformly increasing pulses (e.g., with each programming pulses increasing in magnitude by the static Vstep level) by a wordline driver of the memory device enables the selected wordline to be ramped or increased to a wordline voltage level ($V_{wl}$) corresponding to a memory access operation. In this regard, the memory cells or bits of a multilevel cell (MLC) are programmed with a set of programming pulses that increase at each successive pulse by the predefined and static increment, resulting in the programming of the memory cells at a specific level. Similarly, the series of programming pulses having a uniformly increasing voltage level can be applied to the wordline to ramp the wordline to the corresponding wordline voltage level during the execution of an erase operation.

A typical design challenge associated with programming memory cells of a memory device is to limit a maximum programming voltage needed to program the memory cells in a memory array. A maximum voltage level associated with the programming operation is reached when all of the identified memory cells have been successfully programmed to a target programming level. In a typical memory device design, programming failures occur when the programming voltages of the incrementally increasing pulses exceeds the limit of the maximum programming voltage. In addition, it is desirable to minimize the time to program the memory cells (also referred to as "Tprog") while avoiding the high maximum voltage levels for the incrementally increasing programming pulses of the programming algorithm.

One approach to minimize the programming time is to utilize a large constant step voltage (e.g., step voltage level of 0.5V) to incrementally increase the programming voltage of the series of programming pulses. For example, each programming pulse can be increased in magnitude by the larger step voltage level, such that a first programming pulse can have a $Vpgm_1$ of 10.0V, a second programming pulse can have a $Vpgm_2$ of 10.5V, a third programming pulse can have a $Vpgm_3$ of 11.0V, and so on. This approach using a larger constant step voltage level (e.g., 0.5V) can achieve faster programming times, however, an undesirable higher maximum programming voltage level associated with the programming operation also results. The resulting higher maximum voltage level adds memory device design cost and complexity to support the higher maximum programming voltage level. In addition, the higher maximum programming voltage level reduces the memory cell reliability, leading to increased program disturb errors, hot electron disturb errors, etc.

To address the problems associated with requiring the use of a high maximum voltage level for the programming pulses needed to program all of the target memory cells, during certain memory access operations, a selective slow program convergence (SSPC) approach can be used. In this approach, multiple pre-verify voltage levels are calculated prior to initiating the pre-charging. The memory cells are programmed with incrementally increased programming pulses applied to wordlines to which the memory cells are coupled. After each pulse, a program verify operation determines the threshold voltage for each cell. When the threshold voltage reaches a pre-verify threshold, only the bitline connected to that particular cell is biased with a fixed or static intermediate voltage that slows down the change in the threshold voltage of the cell. The other cells continue to be programmed at their normal pace. As the threshold voltage for each cell reaches the pre-verify level, it is biased with the intermediate voltage. All of the bitlines are biased with an inhibit voltage as their threshold voltages reach the verify voltage threshold.

According to this approach, each bitline that is coupled to a memory cell of the plurality of memory cells is selectively biased with a first bitline voltage in response to the threshold voltage of the associated memory cell reaching a pre-verify threshold voltage. The pre-verify threshold voltage is less than a verify threshold voltage. The applied bitline voltage is a fixed digital voltage (e.g., a voltage in the range of 0.5V to 0.9V) that is typically greater than 0V and less than the inhibit voltage (e.g., VCC). In this approach, the programming is slowed down to improve the accuracy of the programming at the later programming pulses, but disadvantageously results in a large number of programming pulses with increasing programming voltages that approach and exceed the maximum programming voltage limit and slower programming times.

Aspects of the present disclosure address the above and other deficiencies by implementing a programming operation including a series of programming pulses having a dynamically adjustable step voltage level (Vstep) applied to wordlines to which one or more target memory cells are connected to gradually raise the voltage level of the target memory cells to above a wordline voltage level corresponding to the memory access operation. In an embodiment, a programming operation is executed which includes a first portion or set of a series programming pulses having a programming voltage level (Vpgm) that increases with each programming pulse by an initial step voltage level ($Vstep_1$). For example, each of the programming pulses of the first portion of the series of programming pulses can be increased by the $Vstep_1$ amount (e.g., 0.55V). In an embodiment, a first slope of the programming voltages of the first set of programming pulses incremented by the initial step voltage ($Vstep_1$) can have a first value (e.g., approximately 1).

In response to a programming pulse of the first portion of programming pulses reaching or exceeding a programming voltage threshold level ($Vpgm_{threshold}$), the step voltage level is adjusted from the initial step voltage level ($Vstep_1$) to an adjusted step voltage level (e.g., $Vstep_2$). In an embodiment, a next programming pulse (e.g., a first programming pulse of a second portion or set of programming pulses) is applied using the adjusted step voltage level, such that each programming pulse of the second portion of programming pulses is increased by the adjusted step voltage level. In an embodiment, the adjusted step voltage level is a smaller value (e.g., 0.1V, 0.2V, etc.) than the initial step voltage level, such that the slope of the programming voltages of the second set of programming pulses is larger as compared to the slope of the programming voltages of the first set of programming pulses.

According to embodiments, multiple programming voltage threshold levels can be applied and monitored. For example, upon reaching a first programming voltage threshold level (e.g., 22.0V), the voltage step level can be adjusted the initial Vstep level to a first adjusted Vstep level. In this example, upon reaching a second programming voltage threshold level (e.g., 22.5V), the Vstep level can be adjusted from the first adjusted Vstep level (e.g., 0.2V) to a second adjusted Vstep level (e.g., 0.1V). According to embodiments, any number of programming voltage threshold levels can be employed with each one having a corresponding Vstep adjustment level such that the Vstep associated with a next set of one or more programming pulses is adjusted upon reaching each of the respective programming voltage threshold levels.

In an embodiment, the programming operation can establish a programming voltage threshold level, such that each subsequent programming pulse is increased by a different dynamically adjusted Vstep level amount. For example, in response to determining that the programming voltage of a programming pulse (e.g., Pulse N) reached or exceeded the programming voltage threshold level, a first programming voltage of a first subsequent programming pulse (e.g., $Vpgm_{N+1}$ of programming pulse N+1) can be applied using a first adjusted Vstep level, a second programming voltage of a second subsequent programming pulse (e.g., $Vpgm_{N+2}$ of programming pulse N+2) can be applied using a second adjusted Vstep level, and so on until all of the programming pulses have been applied.

In an embodiment, in response to determining that the programming voltage of a programming pulse reaches or exceeds the programming voltage threshold voltage, a duration of one or more subsequent programming pulses can be adjusted. For example, upon satisfaction of the condition associated with the programming voltage threshold level (e.g., a programming pulse having a magnitude that is greater than the programming voltage threshold level), an initial programming pulse duration (Tpulse1) of a first set of programming pulses can be adjusted (e.g., lengthen or increased) to an adjusted programming pulse duration (Tpulse2) for a second set of one or more programming pulses.

Advantageously, the maximum voltage level needed to program the memory cells of the memory device to the desired programming levels is reduced by using the dynamically adjusted step voltage level of the programming operation according to embodiments of the present disclosure. Furthermore, the reduced maximum voltage level is achieved without a substantial increase the overall programming time associated with the execution of the programming operation. Accordingly, the adjustment of the step voltage level (e.g., reducing the step voltage level) associated with the series of programming pulses of the programming operation of the present disclosure results in a lower maximum voltage level which produces fast, efficient, accurate, and reliable programming as compared to a typical ISPP programming algorithm including a predetermined and uniform step voltage between programming pulses. Specifically, desired programming times can be maintained while avoiding significant increases to the maximum programming voltage magnitude required to program all of the target memory cells. In this regard, desired placement of memory cells in the target programming distributions is achieved with improved memory cell reliability (e.g., fewer program disturb errors, fewer hot electron disturb errors, etc.)

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes a program manager 134 configured to carry out corresponding memory access operations, in response to receiving the memory access commands from memory interface 113. In some embodiments, local media controller 135 includes at least a portion of program manager 134 and is configured to perform the functionality described herein. In some embodiments, program manager 134 is implemented on memory device 130 using firmware, hardware components, or a combination of the above. In one embodiment, program manager 134 receives, from a requestor, such as memory interface 113, a request to program data to a memory array of memory device 130. The memory array can include an array of memory cells formed at the intersections of wordlines and bitlines. In one embodiment, the memory cells are grouped in to blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of 8 programming distributions representing the 8 different combinations of the three bits stored in each memory cell. Depending on how they are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, program manager 134 can receive data to be programmed to the memory device 130 (e.g., a TLC memory device). Accordingly, program manager 134 can execute a programming operation including a series of programming pulses that are applied to a wordline associated with a set of target memory cells to program each memory cell to one of 8 possible programming levels (i.e., voltages representing the 8 different values of those three bits). In one embodiment, program manager 134 can program memory cells in the TLC portion of the memory array to the multiple respective programming levels (e.g., programming levels L0, L1, L2 ... L7) using an adjustable step voltage level to establish the programming voltage level for each of the series of programming pulses. For example, upon identifying a set of memory cells to be programmed (e.g., the memory cells associated with one or more wordlines of the memory array), program manager 134 can cause a first set of programming pulses to be applied to the associated wordline, where a programming voltage (Vpgm) of each programming pulse of the first set of programming pulses is incremented by an initial step voltage level ($Vstep_{initial}$). For example, a first programming pulse of the first set of programming pulses is applied to the wordline at a first programming voltage (e.g., $Vpgm_1$), a second programming pulse is applied to the wordline at a second programming voltage (e.g., $Vpgm2=Vpgm1+Vstep_{initial}$), a third programming pulse of the first step of programming pulses is applied to the wordline at a third programming voltage (e.g., $Vpgm3=Vpgm2+Vstep_{initial}$), and so on.

In an embodiment, the program manager 134 can maintain a programming voltage threshold level ($Vpgm_{threshold}$) for use in determining when a condition is satisfied. In an embodiment, the program manager 134 compares the programming voltage of a programming pulse in the first set of programming pulses to the programming voltage threshold level and determines the condition is satisfied when the programming voltage is greater than or equal to the programming voltage threshold level. In an embodiment, in response to determining the programming voltage of a programming pulse in the first set of programming pulses is greater than or equal to the programming voltage threshold level, the program manager 134 adjusts the step voltage level from the initial step voltage level ($Vstep_{initial}$) to an adjusted step voltage level ($Vstep_{adjusted}$). In an embodiment, a second set of one or more programming pulses are applied to the wordline of the target memory cells where the programming voltage of each programming pulse is incremented by the adjusted step voltage level. For example, if the program manager 134 determines that the programming voltage of programming pulse N (e.g., $Vpgm_N$) is greater than or equal to the programming voltage threshold level ($Vpgm_{threshold}$), a next programming pulse (i.e., programming pulse N+1) is applied with a programming voltage VpgmN+1 that is incremented by the adjusted step voltage level (e.g., $Vpgm_{N+1}=Vpgm_N+Vstep_{adjusted}$). In an embodiment, the adjusted step voltage level is lower or decreased as compared to the initial step voltage level (e.g., $Vstep_{adjusted} < Vstep_{initial}$).

In an embodiment, the program manager 134 can modify or adjust a duration of one or more subsequent programming pulses ($T_{pulse}$) in response to satisfying the condition (e.g., in response to determining the Vpgm of a programming pulse is greater than or equal to the $Vpgm_{threshold}$) In an embodiment, each programming pulse of the first set of programming pulses can be applied to the wordline of the target memory cells with an initial pulse duration (e.g., $T_{pulse-initial}$). In an embodiment, upon satisfaction of the condition, the program manager 134 can adjust the pulse duration to an adjusted pulse duration ($T_{pulse-adjusted}$) and apply one or more programming pulses of a second set of programming pulses (e.g., a set of one or more programming pulses applied following satisfaction of the condition) having the adjusted pulse duration. Further details with regards to the operations of program manager 134 are described below.

Figure 1B:
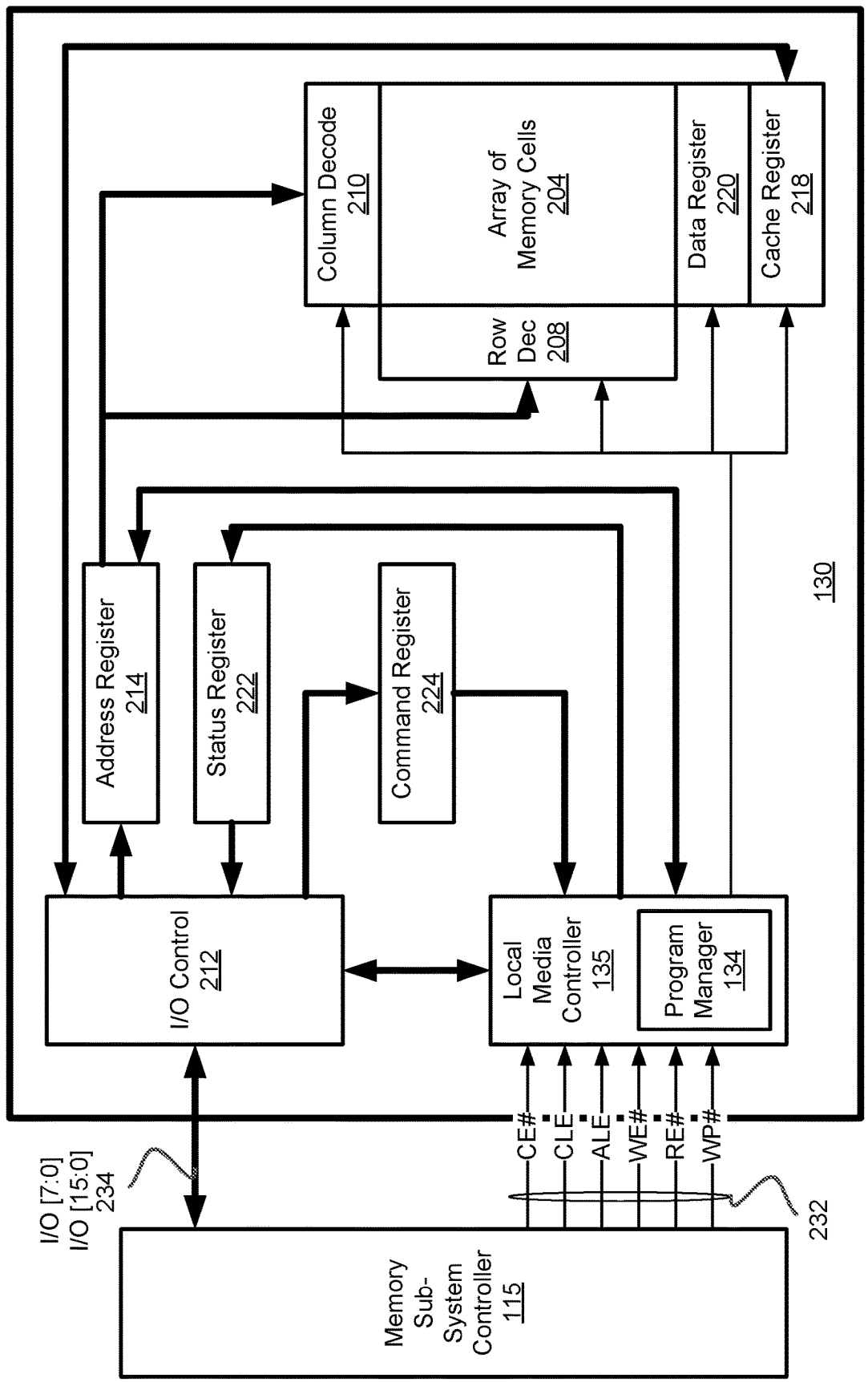
FIG. 1B is a block diagram of a memory device in communication with a memory sub-system controller of a memory sub-system in accordance with one or more embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 150 logically arranged in rows and columns. Memory cells of a logical row are typically connected to the same access line (e.g., a word line) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses. In one embodiment, local media controller 135 includes program manager 134, which can implement the programming of memory device 130 including an adjustable step voltage level, as described herein.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 120 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 120 to the cache register 118. The cache register 118 and/or the data register 120 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 150.

In an embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
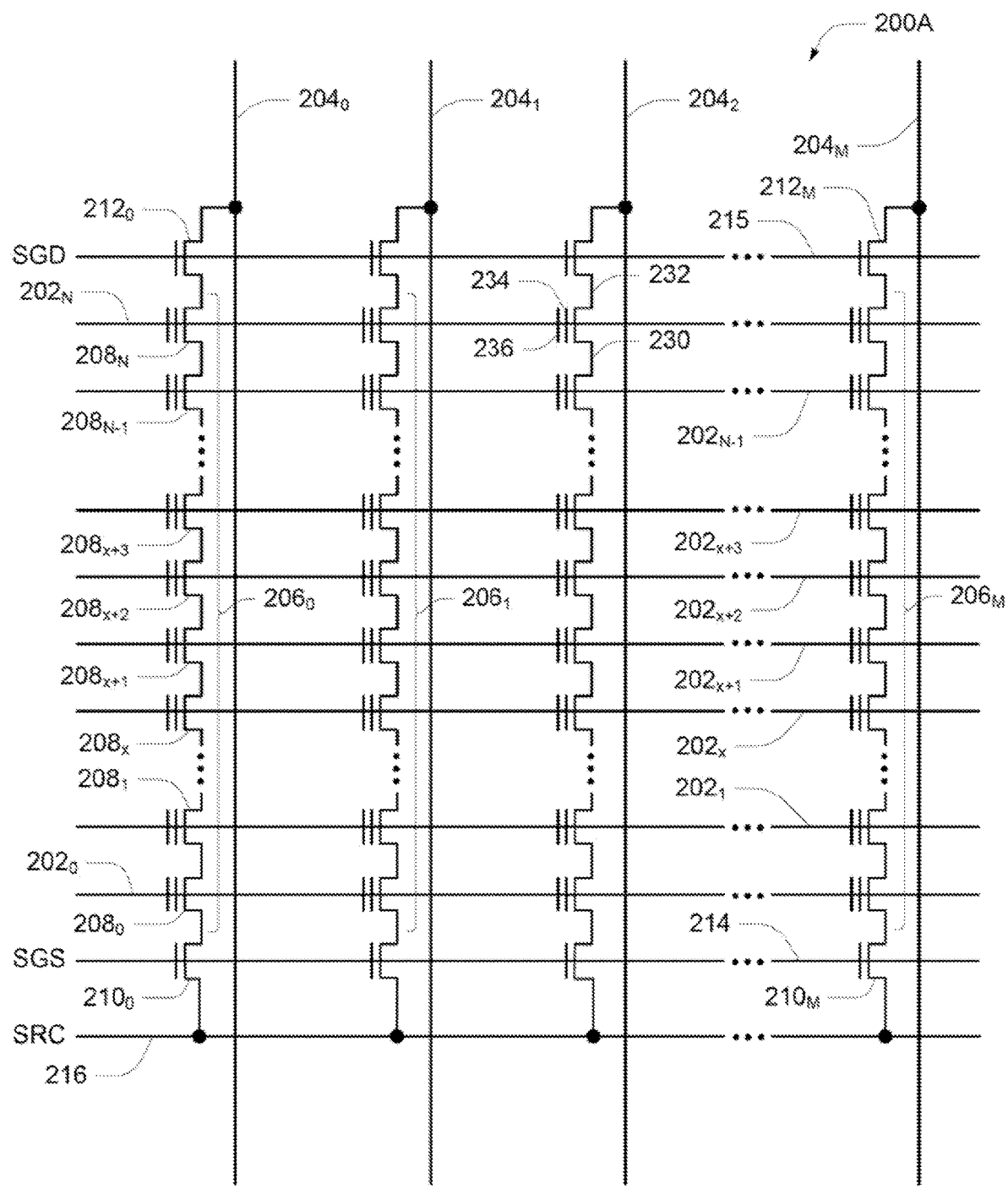
FIG. 2A-2C are schematics of portions of an array of memory cells as could be used in a memory of the type described with reference to FIG. 1B in accordance with one or more embodiments of the present disclosure.
Figure 2B:
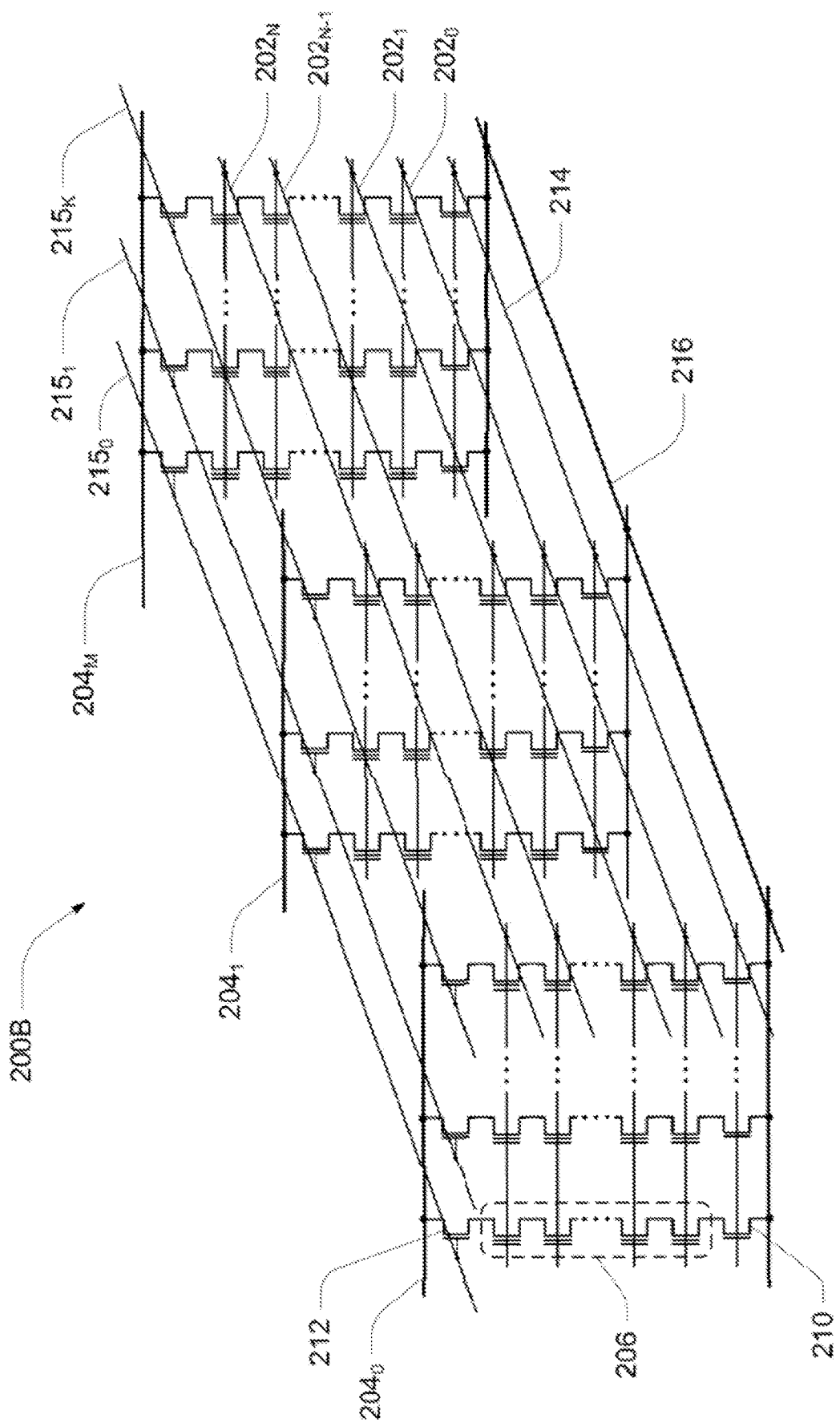
Figure 2C:
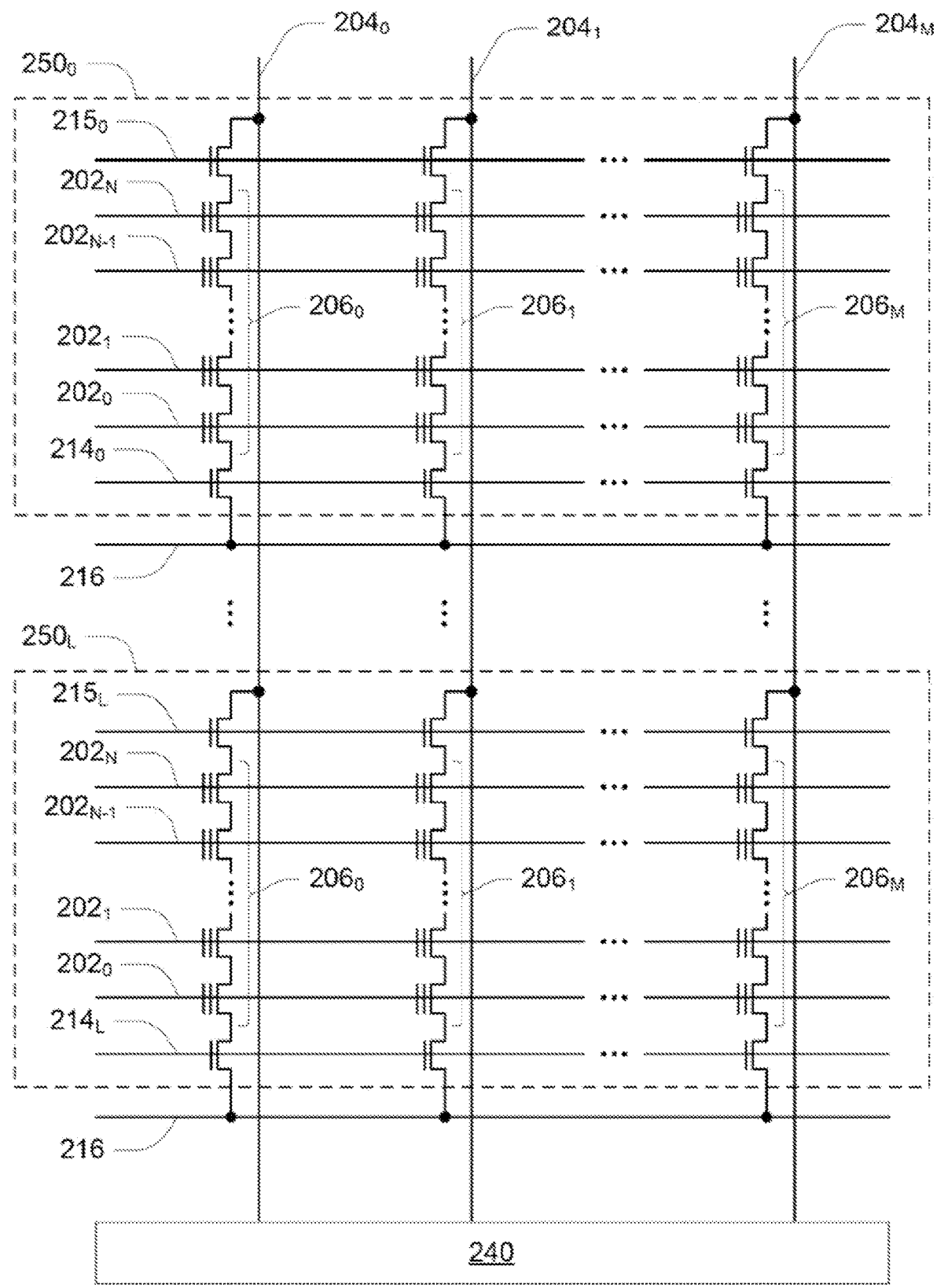

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bitlines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bitline 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to word line $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG.

2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
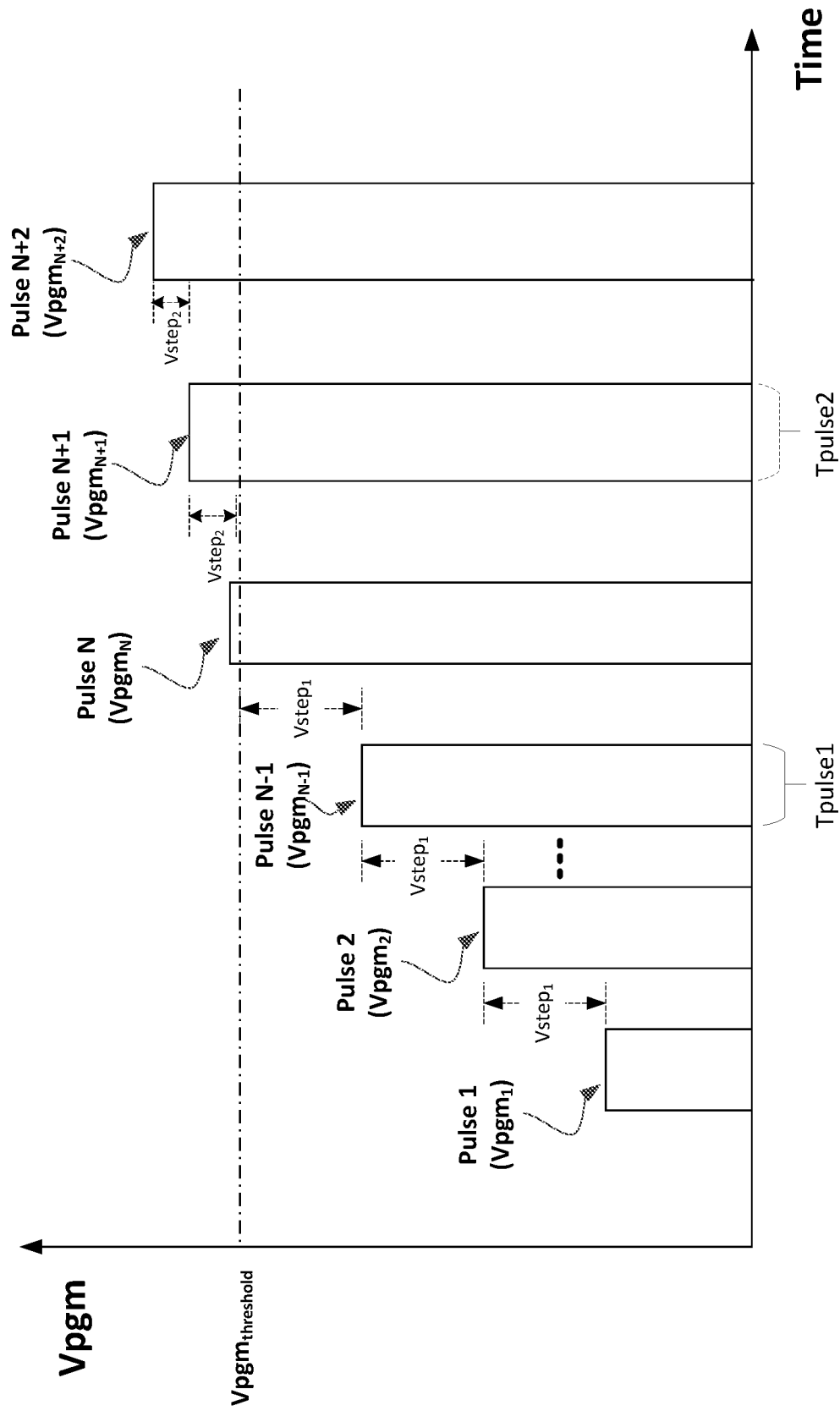
FIG. 4 illustrates example programming pulses according to a programming operation including a dynamically adjusted step voltage level, in accordance with one or more embodiments of the present disclosure.

FIG. 4 illustrates a series of example programming pulses of a programming operation including dynamically adjusted step voltage levels, in accordance with embodiments of the present disclosure. As shown in FIG. 4, the programming operation is executed to cause the application of the series of programming pulses (e.g., pulse 1, pulse 2 . . . pulse N−1, pulse N, pulse N+1, and pulse N+2) to a wordline associated with a set of target memory cells to be programmed to a target programming level of a set of programming levels (e.g., L1 through L7 in a TLC memory device). In an embodiment, as shown in FIG. 4, a first set of programming pulses are applied (e.g., pulse 1 through pulse N), where each programming pulse has a programming voltage (Vpgm) that is incrementally increased by an initial step voltage level ($Vstep_1$). For example, the initial step voltage level ($Vstep_1$) has a value of 0.55V. In the example shown, at a first time, programming pulse 1 is applied having a programming voltage of $Vpgm_1$. At a second time, programming pulse 2 is applied having a programming voltage of Vpgm2, where Vpgm2=Vpgm1+$Vstep_1$). The programming operation continues with the application of programming pulses having programming voltage levels that increase by the initial step voltage level.

As shown in FIG. 4, programming pulse N is applied having a programming voltage $Vpgm_N$=$Vpgm_{N-1}$+$Vstep_1$. According to embodiments, a determination is whether a programming pulse satisfies a condition where the programming voltage of the programming pulse is greater than or equal to a programming voltage threshold level ($Vpgm_{threshold}$), denoted by the dashed line in FIG. 4. In an embodiment, a comparison is performed between the programming voltage of each programming pulse (e.g., $Vpgm_1$, $Vpgm_2$ . . . $Vpgm_N$) and the programming voltage threshold level ($Vpgm_{threshol}$). In response to determining that the programming voltage of a programming pulse is greater than or equal to the programming voltage threshold level, the step voltage level is adjusted from the initial step voltage level to an adjusted step voltage level.

In the example shown, it is determined that the programming voltage of pulse N ($Vpgm_N$) is greater than the programming voltage threshold level ($Vpmg_{threshold}$), and as such, the condition is satisfied. In response to determining that $Vpgm_N$ is greater than $Vpgm_{threshold}$, the step voltage level is adjusted (e.g., from $Vstep_1$ to $Vstep_2$) for use in determining the programming voltage of a next programming pulse. In the example shown, programming pulse N+1 is applied with a programming voltage that is based on the adjusted step voltage level. In an embodiment, the programming voltage of pulse N+1 is represented by the following expression:

$$Vpgm_{N+1}=Vpgm_N+Vstep_2$$

In an embodiment, the adjusted step voltage level (e.g., $Vstep_2$) can be less than the previously used step voltage level (e.g., the initial step voltage level ($Vstep_1$) as shown in the example of FIG. 4. For example, the initial step voltage level can be approximately 0.55V and the adjusted step voltage level can be approximately 0.10V. In an embodiment, a next set of one or more programming pulses (e.g., pulse N+1 and pulse N+2, as shown in FIG. 4) are applied with programming voltages determined based on the adjusted step voltage level. In an embodiment, in the example shown, the first set of programming pulses including pulse 1 through pulse N are applied with programming voltages determined based on $Vstep_1$ and the second set of programming pulses including pulse N+1 through pulse N+2 are applied with programming voltages determined based on $Vstep_2$. Advantageously, the dynamic adjustment of the step voltage level enables the maximum programming voltage level to be controlled, such that the maximum programming voltage level does not exceed a desired limit (e.g., is less than a maximum programming voltage level limit of 23V, beyond which programming failures occur), while maintaining desired programming times.

According to an embodiment, upon satisfaction of the condition, the step voltage level can be adjusted for each of the following programming pulses, until the programming operation is complete. For example, a first adjusted step voltage level ($Vstep_2$) can be established for determining $Vpgm_{N+1}$, a second adjusted step voltage level (e.g., a step voltage level that is less than $Vstep_2$) can be established for determining $Vpgm_{N+2}$, and so on until all of the programming pulses have been applied.

According to embodiments, multiple programming voltage threshold levels can be established (e.g., in addition to $Vpgm_{threshold}$, one or more additional threshold voltage levels can be employed) and used for comparison with the programming voltage of the respective programming pulses to determine when an additional condition is satisfied. In response to determining a programming voltage of a programming pulse exceeds an additional programming voltage threshold, a further or additional adjustment of the step voltage level can be executed. For example, a second programming voltage threshold can be used to determine when to adjust $Vstep_2$ to a new step voltage level (e.g., $Vstep3$; not shown in FIG. 4).

In an embodiment, in response to the satisfaction of the condition (e.g., upon determining that $Vpgm_N$ is greater than $Vpgm_{threshold}$), in addition to the adjustment of the step voltage level, a programming pulse duration (Tpulse) of a next one or more programming pulses can be adjusted from an initial pulse duration ($Tpulse_1$) to an adjusted pulse duration ($Tpulse_2$). As shown in FIG. 4, the first set of programming pulses (e.g., pulse 1 through pulse N) have a first or initial pulse duration ($Tpulse_1$). In response to determining that $Vpgm_N$ is greater than $Vpgm_{threshold}$), an adjustment can be made to the pulse duration to establish an adjusted pulse duration of $Tpulse_2$, such that the subsequent one or more programming pulses (e.g., pulse N+1 and pulse N+2) are applied using the adjusted pulse duration. In an embodiment, the adjusted pulse duration ($Tpulse_2$) can be longer than the initial pulse duration ($Tpulse_1$). For example, the initial pulse duration ($Tpulse_1$) can be approximately 10 μs and the adjusted pulse duration (Tpulse2) can be approximately 20 μs).

Figure 5:
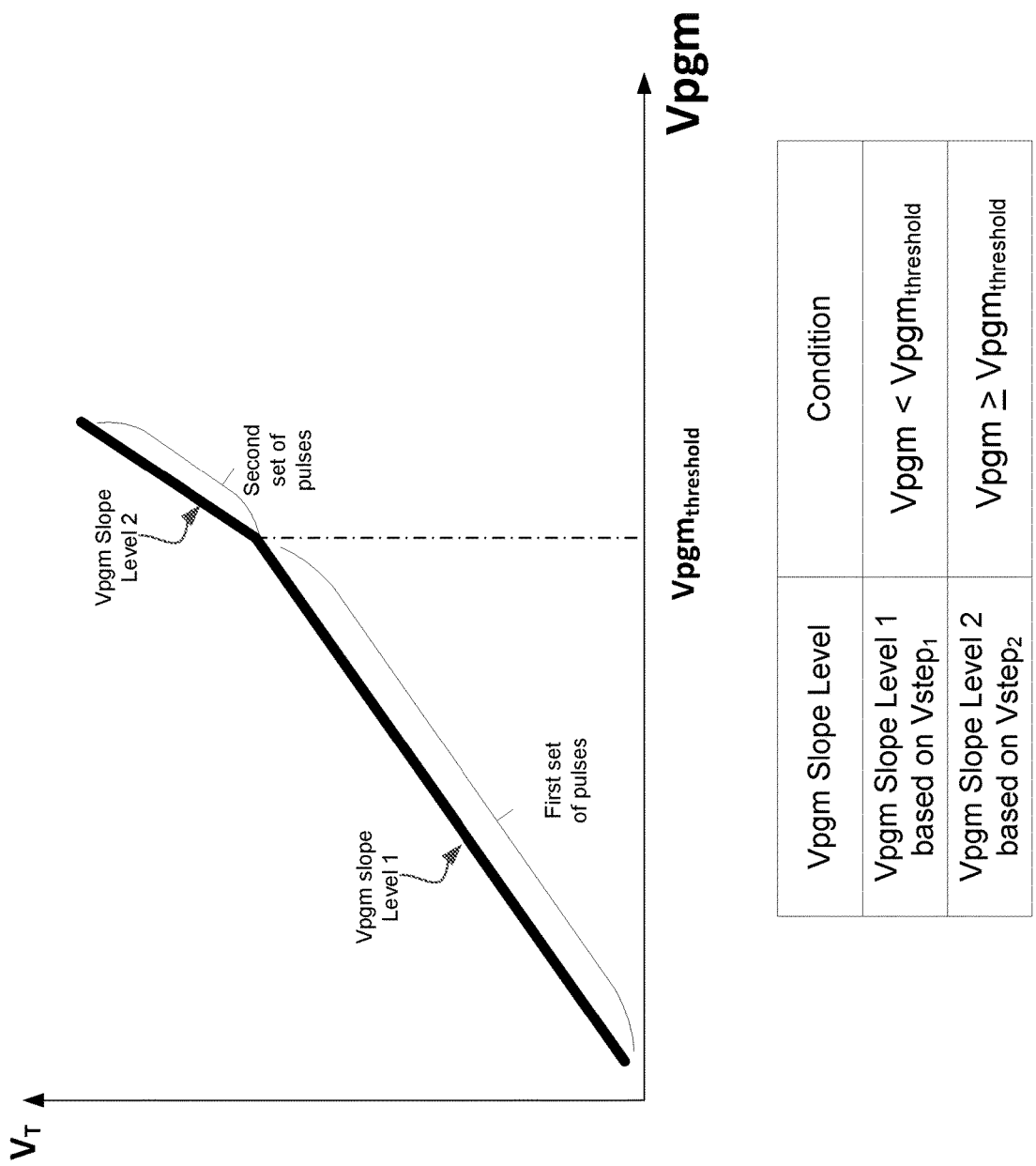
FIG. 5 illustrates an example plot including a programming voltage level and threshold voltage level corresponding to a programming operation including a dynamically adjusted step voltage level, in accordance with one or more embodiments of the present disclosure.

FIG. 5 illustrates an example plot including a programming voltage level and threshold voltage level corresponding to a programming operation including a dynamically adjusted step voltage level, in accordance with one or more embodiments of the present disclosure. As shown in FIG. 5, the programming operation is initiated and a first set of pulses is applied to a wordline associated with a set of target memory cells to be programmed. As shown in FIG. 5, the first set of pulses are applied with increasing programming voltages based on an initial step voltage level (e.g., $Vstep_1$) such that the programming voltages of the first set of programming pulses have a first slope level corresponding to the initial step voltage level. In an embodiment, in response to determining that the programming voltage of a programming pulse is greater than or equal to the programming voltage threshold level ($Vpgm_{threshold}$), the step voltage level is adjusted from the initial step voltage level to an adjusted step voltage level. The adjusted step voltage level is used to establish the programming voltages of the second set of pulses (e.g., the one or more pulses applied following the adjustment of the step voltage level). As shown in FIG. 5, the second set of pulses are applied with increasing programming voltages based on the adjusted step voltage level (e.g., Vstep2) such that the programming voltages of the second set of pulses have a second slope level. As shown in FIG. 5, the adjusted step voltage level is less than the initial step voltage level, and as a result, the second set of pulses has a higher slope than the slope of the first set of programming pulses.

As shown in FIG. 5, a first set of pulses of a series of programming pulses associated with a programming operation including a dynamically adjustable step voltage level have a programming voltage slope at a first level when the corresponding programming voltages (Vpgm) is less than the programming voltage threshold ($Vpgm_{threshold}$). Upon satisfaction of the condition where Vpgm is greater than or equal to the $Vpgm_{hreshold}$, a transient Vpgm slope is established by adjusting the step voltage level for use in establishing the programming voltages for the second set of programming pulses.

FIG. 6 is an example data structure 600 including information identifying adjustable step voltage levels of a programming operation corresponding to different wordline groups associated with memory cells of a memory array, in accordance with one or more embodiments of the present disclosure. In an embodiment, the adjustment to the step voltage level can be dependent upon the selected wordline associated with the set of target memory cells to be programmed. For example, as shown, a first wordline group including one or more wordlines can be associated with an initial Vstep value of approximately 0.55V and an adjusted Vstep value of approximately 0.10V, a second wordline group including one or more wordlines can be associated with an initial Vstep value of approximately 0.50V and an adjusted Vstep value of approximately 0.15V, and an Nth wordline group is a data structure including information identifying adjustable step voltage levels of a programming operation corresponding to different wordline groups associated with memory cells of a memory array, in accordance with one or more embodiments of the present disclosure.

In an embodiment, processing logic (e.g., program manager 134 of FIGS. 1A and 1B) can receive a request for the execution of a programming operation including the application of a series of programming pulses with an adjustable step voltage level to program a target set of memory cells. The processing logic can identify a wordline group associated with the target set of memory cells and perform a look-up operation of the data structure 600 to identify an initial step voltage level and an adjusted step voltage level associated with the identified wordline group. The series of programming pulses are then applied to the identified wordline with programming voltages being incremented for a first set of programming pulses using the initial step voltage level associated with the wordline. Upon determining that a programming voltage of a programming pulse of the first set of pulses equals or exceeds a programming voltage threshold, the processing logic applies a next one or more programming pulses having a programming voltage established based on the adjusted step voltage level associated with the wordline. As illustrated in FIG. 6, the initial and adjusted step voltage levels can be established and customized for different wordline groups to enable efficient execution of the programming operation with the dynamically adjusted step voltage to limit the maximum programming voltage without introducing substantially longer programming times.

In an embodiment, the data structure 600 can also include information identifying an initial pulse duration value (Initial Tpulse) and adjusted pulse duration value (Adjusted Tpulse) corresponding to each of the different wordline groups.

Figure 7:
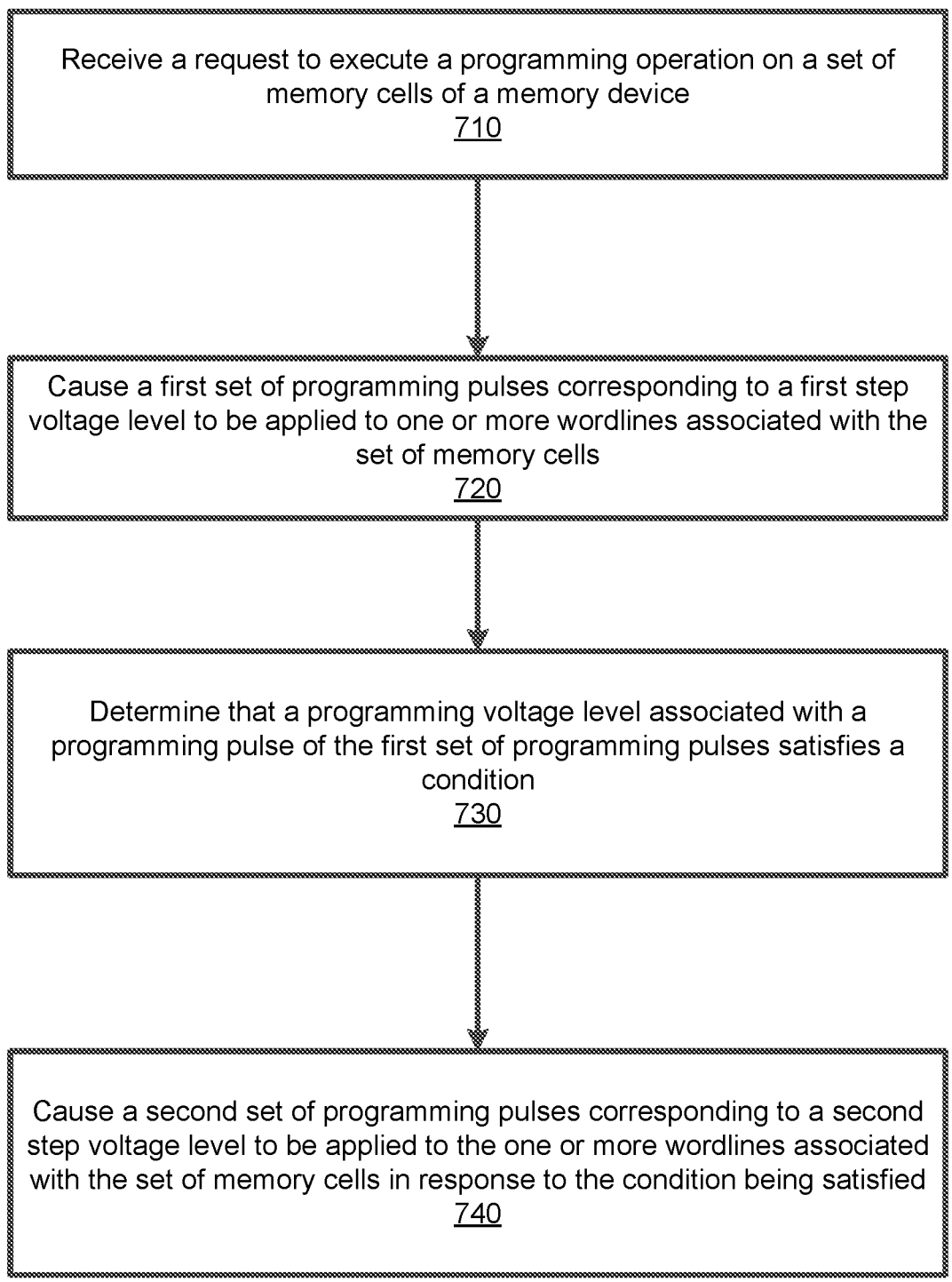
FIG. 7 is a flow diagram of an example method of executing a programming operation including a sequence of programming pulses that can be increased using an adjustable step voltage level to program one or more memory cells of a memory device, in accordance with one or more embodiments of the present disclosure.

FIG. 7 is a flow diagram of an example method of dynamically adjusting a step voltage level during programming of memory cells, in accordance with one or more embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by program manager 134 of FIGS. 1A and 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 710, a request is received. For example, processing logic (e.g., program manager 134) can receive a request to execute a programming operation to program a set of memory cells of a memory device. In an embodiment, the request includes information identifying programming operation to program each of the set of memory cells to a target programming level of a set of programming levels (e.g., L1 to L7; wherein L0 is an erase state). In an embodiment, the program operation is directed to one or more specific memory cell addresses. In one embodiment, the processing logic can identify a wordline associated with the set of memory cells. In an embodiment, in response to request, the processing logic can identify an initial step voltage level and an adjusted step voltage level associated with the identified wordline associated with the set of memory cells (e.g., using a data structure such as the table shown in FIG. 6). In one embodiment, the set of memory cells are configured as MLC memory (e.g., any type of memory cells that store more than one bit per cell including 2 bits, 3 bits, 4 bits, or more bits per cell). In an embodiment, the identified set of memory cells are to be programmed to multiple programming levels (e.g., L1, L2 ... L7 for a TLC memory device). In an embodiment, the request includes a set of physical or logical addresses corresponding to the set of memory cells to be programmed. In an embodiment, the processing logic identifies the set of memory cells based on the set of addresses provided as part of the request.

At operation 720, a first set of programming pulses are applied. For example, the processing logic can cause a first set of programming pulses corresponding to a first step voltage level to be applied to one or more wordlines associated with the set of memory cells. In an embodiment, each of the first set of programming pulses are applied at a programming voltage that increases incrementally by the first step voltage level ($Vstep_1$). For example, at a first time, a first programming pulse of the first set of programming pulses having a first programming voltage ($Vpgm_1$) is applied to the one or more wordlines. At a second time, a second programming pulse having a second programming voltage ($Vpgm_2$) is applied, where the $Vpgm_2 = Vpgm_1 + Vstep_1$. At a third time, a third programming pulse having a third programming voltage (Vpgm3) is applied, where $Vpgm_3 = Vpgm_2 + Vstep_1$. In an embodiment, the incremental increasing of the programming voltages of the first set of pulses by the first step voltage level continues for each programming pulse of the first set of programming pulses.

At operation 730, a determination is made. For example, the processing logic can determine that a programming voltage associated with a programming pulse of the first set of programming pulses satisfies a condition. In an embodiment, the condition is satisfied when the programming voltage associated with the programming pulse (e.g., VpgmN representing the programming voltage of the Nth programming pulse of the first set of programming pulses) is greater than or equal to a programming voltage threshold level ($Vpgm_{threshold}$). In an embodiment, the processing logic can compare the programming voltage of at least a portion of the first set of programming pulses to the programming voltage threshold level to determine if the condition is satisfied.

In an embodiment, the programming voltage threshold level (e.g., 20V, 21V, 22V, 23V, etc.) can be established and maintained by the processing logic (e.g., stored in a cache) and used for comparison with the programming voltages of the set of pulses applied using the first step voltage level. For example, with reference to FIG. 4, the processing logic can determine that Pulse N, having a programming voltage of $Vpgm_N$) is greater than the programming voltage threshold level ($Vpgm_{threshold}$).

At operation 740, a second set of programming pulses are applied. For example, the processing logic can cause a second set of programming pulses corresponding to a second step voltage level to be applied to the one or more wordlines associated with the set of memory cells in response to the condition being satisfied. In an embodiment, in response to the determination that the condition has been satisfied, the processing logic identifies and employs the second (or adjusted) step voltage level in establishing the programming voltages of a second set of programming pulses. In an embodiment, the second set of programming pulses includes one or more programming pulses applied to the one or more wordlines associated with the set of memory cells until the programming operation is completed (e.g., all of the set of memory cells have been programmed to a respective target programming level).

In an embodiment, the second or adjusted step voltage level is less than the first step voltage level, such that the programming voltage of each pulse of the second set of pulses is incremented by a smaller or lower value as compared to the incremental increase of the programming voltage of the first set of pulses. For example, the first step voltage level can be approximately 0.55V and the second step voltage level can be approximately 0.10V.

In an embodiment, the processing logic can determine the second step voltage level that corresponds to the one or more wordlines associated with the set of memory cells being programmed. For example, the processing logic can perform a look-up operation of a data structure (e.g., data structure 600 of FIG. 6) including information identifying the first and second step voltage levels on a per wordline-group basis.

In an embodiment, in response to the condition being satisfied, the processing logic can cause the second set of programming pulses to be applied with an adjusted pulse duration, as compared to the first set of programming pulses. For example, in this embodiment, the first set of programming pulses can have a first pulse duration (e.g., Tpulse1 of FIG. 4) and the second set of programming pulses can have a second pulse duration (e.g., Tpulse2 of FIG. 4). In this embodiment, in response to satisfaction of the condition, the processing logic can adjust the pulse duration of the one or more subsequent programming pulses (e.g., the second set of programming pulses). In an embodiment, the second pulse duration can be greater than the first pulse duration.

In an embodiment, one or more additional programming voltage threshold levels can be maintained and used for comparison with the programming voltages of the applied programming pulses. For example, an additional programming voltage threshold level (e.g., $Vpgm_{threshold2}$) having a higher voltage level than $Vpgm_{threshold}$ can be maintained. In this embodiment, an additional adjustment of the step voltage (e.g., the establishing of a third step voltage level) can be performed by the processing logic upon determining a programming voltage of a programming pulse of the second set of programming pulses is greater than or equal to the additional programming voltage threshold level m ($Vpgm_{threshold2}$). In an embodiment, any number of programming threshold levels can be used to establish multiple conditions, such that when each respective condition is satisfied (e.g., a programming voltage is greater than or equal to a programming threshold level), an adjusted step voltage is applied for a subsequent one or more programming pulses. According to embodiments, an adjustment to the pulse duration can also be made in response to the satisfaction of the conditions associated with the multiple different programming voltage threshold levels.

Advantageously, controlling the different sets of programming pulses in accordance with different adjusted step voltage levels enables the completion of the programming operation (e.g., the programming of the set of memory cells) while limiting the maximum voltage needed to complete the programming operation, while satisfying programming time requirements. In this regard, programming failures associated with exceeding a maximum programming voltage are avoided by adjusting the step voltage for one or more programming pulses applied during a last stage of the programming algorithm. Furthermore, using the dynamically adjusted step voltage for the programming pulses in the second set (e.g., the final few programming pulses) enables the set of memory cells to be programmed using substantially the same number of total programming pulses, while requiring a lower maximum programming voltage, and without substantially increasing the total programming time.

Figure 8:
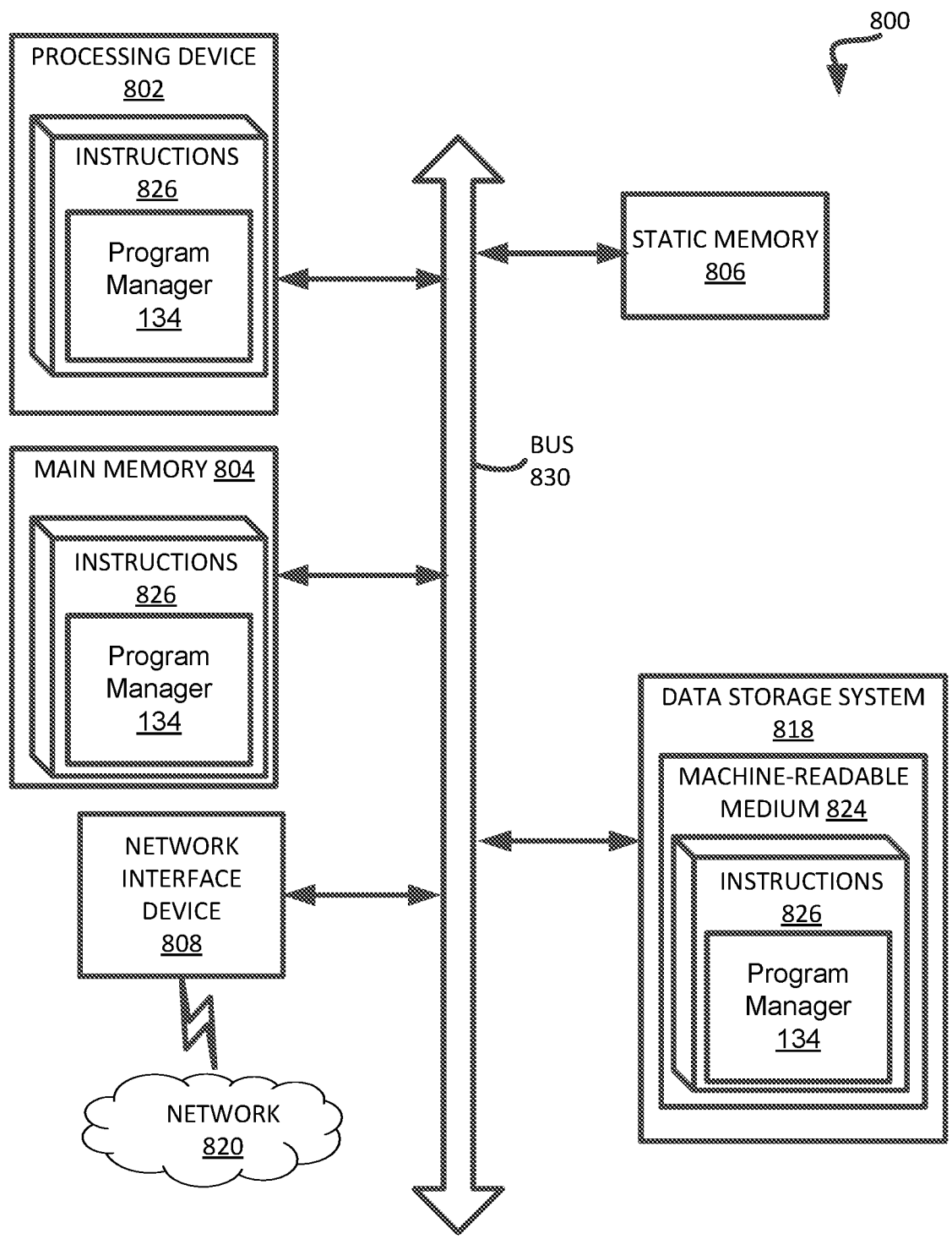
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to program manager 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium, such as a non-transitory computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory sub-system 110 of FIG. 1.

In one embodiment, the instructions 826 include instructions to implement functionality corresponding to program manager 134 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer.

Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory array comprising a set of memory cells; and
   processing logic, operatively coupled with the memory array, to perform operations comprising:
     receiving a request to execute a programming operation on the set of memory cells;
     causing a first set of programming pulses corresponding to a first step voltage level to be applied to one or more wordlines associated with the set of memory cells;
     determining that a programming voltage level associated with a programming pulse of the first set of programming pulses satisfies a condition, wherein the condition is satisfied when the programming voltage level is greater than or equal to a programming voltage threshold level; and
     causing a second set of programming pulses corresponding to a second step voltage level to be applied to the one or more wordlines associated with the set of memory cells in response to the condition being satisfied.

2. The memory device of claim 1, the operations further comprising comparing the programming voltage level associated with the programming pulse to the programming voltage threshold level.

3. The memory device of claim 1, wherein the second step voltage level is less than the first step voltage level.

4. The memory device of claim 1, wherein a respective programming voltage level of each programming pulse in the first set of programming pulses increases by the first step voltage level, and wherein a respective programming voltage of each programming pulse in the second set of programming pulses increases by the second step voltage level, and wherein the second step voltage level is less than the first step voltage level.

5. The memory device of claim 1, wherein each of the first set of programming pulses have a first pulse duration.

6. The memory device of claim 5, the operations further comprising adjusting the first pulse duration to a second pulse duration in response to the condition being satisfied, wherein each of the second set of programming pulses have the second pulse duration.

7. The memory device of claim 1, the operations further comprising:
   determining that a further programming voltage level associated with a further programming pulse of the second set of programming pulses satisfies an additional condition; and
   causing a third set of programming pulses corresponding to a third step voltage level to be applied to the one or more wordlines associated with the set of memory cells in response to the additional condition being satisfied.

8. A non-transitory computer readable medium comprising instructions, which when executed by a processing device, cause the processing device to perform operations comprising:
   receiving a request to execute a program operation on a set of memory cells;
   determining that a programming voltage level associated with a programming pulse of a first set of programming pulses associated with a first step voltage level satisfies a condition, wherein the condition is satisfied when the programming voltage level is greater than or equal to a programming voltage threshold level; and
   causing a second set of programming pulses corresponding to a second step voltage level to be applied to a wordline associated with the set of memory cells in response to the condition being satisfied.

9. The non-transitory computer readable medium of claim 8, wherein the second step voltage level is less than the first step voltage level.

10. The non-transitory computer readable medium of claim 8, wherein each of the first set of programming pulses have a first pulse duration.

11. The non-transitory computer readable medium of claim 10, the operations further comprising adjusting the first pulse duration to a second pulse duration in response to the condition being satisfied, wherein each of the second set of programming pulses have the second pulse duration.

12. The non-transitory computer readable medium of claim 9, wherein the second step voltage level is used to establish programming voltage levels of the second set of programming pulses in response to the first condition being satisfied.

13. The non-transitory computer readable medium of claim 9, the operations further comprising causing a third set of programming pulses corresponding to a third step voltage level to be applied the wordline.

14. A method comprising:
   receiving, by a processing device, a request to execute a programming operation on a set of memory cells;

causing a first set of programming pulses corresponding to a first step voltage level to be applied to one or more wordlines associated with the set of memory cells;

determining that a programming voltage level associated with a programming pulse of the first set of programming pulses satisfies a condition, wherein the condition is satisfied when the programming voltage level is greater than or equal to a programming voltage threshold level; and causing a second set of programming pulses corresponding to a second step voltage level to be applied to the one or more wordlines associated with the set of memory cells in response to the condition being satisfied.

15. The method of claim 14, further comprising comparing the programming voltage level associated with the programming pulse to the programming voltage threshold level.

16. The method of claim 14, wherein the second step voltage level is less than the first step voltage level.

17. The method of claim 14, wherein each of the first set of programming pulses have a first pulse duration.

18. The method of claim 17, further comprising adjusting the first pulse duration to a second pulse duration in response to the condition being satisfied, wherein each of the second set of programming pulses have the second pulse duration.

19. The method of claim 14, further comprising:

determining that a further programming voltage level associated with a further programming pulse of the second set of programming pulses satisfies an additional condition; and causing a third set of programming pulses corresponding to a third step voltage level to be applied to the one or more wordlines associated with the set of memory cells in response to the additional condition being satisfied.

* * * * *